United States Patent
Tsuge

(10) Patent No.: US 9,299,871 B2
(45) Date of Patent: *Mar. 29, 2016

(54) SOLAR CELL, SOLAR CELL MODULE USING SOLAR CELL, AND MANUFACTURING METHOD FOR SOLAR CELL

(75) Inventor: Sadaji Tsuge, Hirakata (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 129 days.

This patent is subject to a terminal disclaimer.

(21) Appl. No.: 13/561,145

(22) Filed: Jul. 30, 2012

(65) Prior Publication Data
US 2012/0291844 A1    Nov. 22, 2012

Related U.S. Application Data

(63) Continuation of application No. PCT/JP2011/056375, filed on Mar. 17, 2011.

(30) Foreign Application Priority Data

Mar. 19, 2010    (JP) .................................. 2010-064800

(51) Int. Cl.
*H01L 31/18*    (2006.01)
*H01L 31/0747*    (2012.01)
(Continued)

(52) U.S. Cl.
CPC .... *H01L 31/0747* (2013.01); *H01L 31/022425* (2013.01); *H01L 31/048* (2013.01);
(Continued)

(58) Field of Classification Search
CPC ..................... H01L 31/022425; H01L 31/048; H01L 31/0747; H01L 31/0745; Y02E 10/50; H02S 30/10
USPC ........................................................ 136/256
See application file for complete search history.

(56) References Cited

U.S. PATENT DOCUMENTS

| 2001/0020486 A1 | 9/2001 | Tsuge |
| 2005/0150543 A1* | 7/2005 | Nakashima et al. ........... 136/256 |
| 2006/0283499 A1* | 12/2006 | Terakawa et al. .............. 136/258 |
| 2007/0056625 A1* | 3/2007 | Higuchi et al. ................ 136/244 |

(Continued)

FOREIGN PATENT DOCUMENTS

| EP | 1128444 A2 | 8/2001 |
| EP | 1696492 A1 | 8/2006 |
| EP | 2450961 A1 | 5/2012 |
| JP | 10-275926 A | 10/1998 |
| JP | 2000-058885 A | 2/2000 |

(Continued)

*Primary Examiner* — Matthew Martin
(74) *Attorney, Agent, or Firm* — Marvin A. Motsenbocker; Mots Law, PLLC

(57) ABSTRACT

The present invention is to grant a margin in the control of a depth of a groove when removing a transparent insulation layer after the transparent insulation layer is formed on the entire surface of the transparent conductive layer, thereby provide a solar cell which has superior productivity in mass manufacturing. A solar cell includes an n-type amorphous silicon layer formed on a front-surface side of an n-type monocrystalline silicon the substrate; a front-surface side transparent conductive layer formed on the n-type amorphous silicon layer; a p-type amorphous silicon layer formed on a rear-surface-side of the substrate; and a rear-surface-side transparent conductive layer formed on the p-type amorphous silicon layer. A front-surface side collector electrode is formed by plating on the front-surface side transparent conductive layer whereas a rear-surface-side collector electrode is formed on the rear-surface-side transparent conductive layer by printing.

12 Claims, 10 Drawing Sheets

(51) Int. Cl.
  *H01L 31/20* (2006.01)
  *H01L 31/0224* (2006.01)
  *H01L 31/048* (2014.01)
  *H02S 30/10* (2014.01)
  *H01L 31/00* (2006.01)

(52) U.S. Cl.
  CPC ............ *H01L 31/20* (2013.01); *H01L 31/202* (2013.01); *H02S 30/10* (2014.12); *H01L 31/18* (2013.01); *H01L 31/1804* (2013.01); *Y02E 10/50* (2013.01)

(56) References Cited

U.S. PATENT DOCUMENTS

| 2007/0107773 | A1* | 5/2007 | Fork et al. ..................... 136/256 |
| 2008/0121265 | A1* | 5/2008 | Hishida et al. ................ 136/244 |
| 2012/0097244 | A1  | 4/2012 | Adachi et al. |

FOREIGN PATENT DOCUMENTS

| JP | 2004-228281 A | 8/2004 |
| WO | 2011-002086 A1 | 1/2011 |

\* cited by examiner

SOLAR CELL, SOLAR CELL MODULE USING SOLAR CELL, AND MANUFACTURING METHOD FOR SOLAR CELL

CROSS-REFERENCES TO RELATED APPLICATIONS

This application is based on International Application PCT/JP2011/056375 which claims priority on the basis of Japanese Patent Application No. 2010-064800.

TECHNICAL FIELD

The present invention relates to a solar cell of an improved characteristic, a solar cell module using the solar cell, and a manufacturing method for the solar cell. In particular, the present invention relates to a structure of a front-surface-side collector electrode and a manufacturing method thereof.

Solar cells are expected as a new source of energy since they can convert sun light which is a clean form and inexhaustible supply of energy, directly into electricity.

Solar cells are made from a semiconductor substrate which is made of a crystalline semiconductor material such as monocrystalline silicon and polycrystalline silicon, or a compound semiconductor material such as GaAs and InP.

Among these solar cells, solar cells including a power generation layer provided by a monocrystalline silicon substrate on which an amorphous silicon layer is formed are now gathering attention because of their ability to reduce carrier recombination loss. Of particular interest is a solar cell which utilizes an arrangement where an intrinsic amorphous silicon layer is placed between a monocrystalline silicon layer and an amorphous silicon layer of mutually opposing conductivity types for reduced defect in the interface and improved characteristics of hetero junction interface (hereinafter this solar cell will be called HIT (registered trademark) solar cell).

FIG. 15 is a sectional view showing a configuration of an HIT solar cell. Referring to FIG. 15, an intrinsic (i-type) amorphous silicon layer and a p-type amorphous silicon layer 13 are formed in this order on an n-type crystalline silicon substrate 10, which is made of a crystalline semiconductor such as monocrystalline silicon and polycrystalline silicon. Further thereon, a transparent conductive layer (TCO) 14 is formed of indium oxide doped with tin for example, and a comb-shaped collector electrode 4 is formed of silver (Ag). On the other main surface of the crystalline silicon substrate 10, an i-type amorphous silicon layer and an n-type amorphous silicon layer 11 are formed in this order, and further thereon, a transparent conductive layer 12 and a comb-shaped Ag collector electrode 5 are formed.

The solar cell element as described above is manufactured in the following steps: First, by using plasma CVD method, an i-type amorphous silicon layer and a p-type amorphous silicon layer 13 are formed sequentially on a first main surface of the crystalline silicon substrate 10, while an i-type amorphous silicon layer and an n-type amorphous silicon layer 11 are formed sequentially on a second main surface. Next, a transparent conductive layer 14 and a transparent conductive layer 12 are formed on the amorphous silicon layer 13 and the amorphous silicon layer 11 by spattering method. Then, a comb-shaped collector electrode 4 and collector electrode 5 are formed on the transparent conductive layer 11 and the transparent conductive layer 14 by screen printing method.

In the HIT solar cells as described above, all layers other than the crystalline silicon substrate 10 can be manufactured by using such methods as plasma CVD method, spattering method, screen printing method, etc., under temperatures not higher than 200 degrees Celsius. This prevents distortion in the substrate while making it possible to lower manufacturing cost. Since the HIT solar cells are manufactured in low-temperature environment for reduced thermal damage to the amorphous silicon layers 11, 13, the collector electrodes 4, 5 are also formed by using resin Ag paste for low-temperature environment and curing process. For further improvement in characteristics, efforts are being made for collector electrodes having a narrower width and rear resistance, for example.

Then, in the HIT solar cells, a method for forming electrodes on a transparent electrode in the solar cell by plating technique is disclosed. (See Patent Literature 1)

CITATION LIST

Patent Literature

Patent Literature 1: JP-A 2000-58885 Gazette (FIG. 2)

SUMMARY OF INVENTION

Technical Problem

If plating method is used to form collector electrodes, it is necessary to ensure that plating will not be made in other regions than the regions where the collector electrodes are to be formed. This can be achieved by first forming a resist patterning film on the regions other than for the collector electrodes, then forming the collector electrodes, and then removing the resist film. This method complicates the manufacturing process, however.

As a solution, Patent Literature 1 proposes a method of first forming a transparent insulation layer which has an opening, on a transparent conductive layer by screen printing method, and then forming collector electrodes by plating in the opening where the transparent conductive layer is exposed.

Since collector electrodes formed on the light receiving surface are obstacles in view of sunlight incident, they should desirably be low in their resistance and narrow in their width. According to Patent Literature 1, the transparent insulation layer with an opening is formed by screen printing, so the openings can only be narrowed to a certain limit.

A better solution may be first coating the entire surface of the transparent conductive layer with a transparent insulation layer, then removing part of the transparent insulation layer by etching or laser irradiation, to form a groove thereby exposing part of the transparent conductive layer where the collector electrodes are to be formed.

However, in the HIT solar cells, the transparent conductive layer and the amorphous semiconductor layer have much thinner thickness, compared with the transparent insulation layer, so the grooves may reach the crystalline substrate. The grooves reaching the crystalline substrate damage the junction between the crystalline substrate and the amorphous semiconductor, resulting in decrease in photoelectric conversion characteristics. In order to avoid this, strict conditions must be followed in groove formation for example, which leads to a disadvantage that the formation step is burdensome.

An object of the present invention is to grant a margin in the control of the depth of a groove when removing the transparent insulation layer after the transparent insulation layer is formed on the entire surface of the transparent conductive layer, thereby provide a solar cell which has superior productivity in mass manufacturing, provide a solar cell module using the solar cell, and also provide a method of manufacturing the solar cell and the solar cell module.

Solution to Problem

A solar cell provided by the present invention includes: a crystalline semiconductor substrate of a first conductivity type; a first amorphous semiconductor layer of the first conductivity type formed on a first surface of the crystalline semiconductor substrate; a first collector electrode formed on the first amorphous semiconductor layer; a second amorphous semiconductor layer of a second conductivity type formed on a second surface of the crystalline semiconductor substrate; and a second collector electrode formed on the second amorphous semiconductor layer. With the above, the first collector electrode is formed by plating. The second collector electrode is formed by a method not impairing a junction between the crystalline semiconductor substrate and the second amorphous semiconductor layer, and the first collector electrode covers a smaller area than the second collector electrode.

Also, the invention provides an arrangement that the first amorphous semiconductor layer is formed thereon with a transparent conductive layer and a transparent insulation layer in this order, and the first collector electrode is formed to include a groove made in the transparent insulation layer.

The solar cell may further include a transparent conductive layer on the second amorphous semiconductor layer. In this arrangement, a region in the transparent conductive layer formed with the second collector electrode has the same surface profile as of the other regions in the transparent conductive layer.

The second collector electrode may be formed by printing method or vapor deposition method, or the second collector electrode may be formed by plating method on the entire surface of the second amorphous semiconductor layer.

Also, the first collector electrode may be placed on a light receiving side.

The present invention also provides a solar cell which includes: a crystalline semiconductor substrate of a first conductivity type; a first amorphous semiconductor layer of the first conductivity type formed on a first surface of the crystalline semiconductor substrate; a first collector electrode formed on the first amorphous semiconductor layer; a second amorphous semiconductor layer of a second conductivity type formed on a second surface of the crystalline semiconductor substrate; and a second collector electrode formed on the second amorphous semiconductor layer. With the above, the first amorphous semiconductor layer is formed thereon with a transparent conductive layer and a transparent insulation layer in this order. The first collector electrode is formed to include a groove made in the transparent insulation layer. The second amorphous semiconductor layer is formed with a transparent conductive layer thereon. The second collector electrode is formed on a surface of the second transparent conductive layer, and a region in the transparent conductive layer formed with the second collector electrode having the same surface profile as of the other regions in the transparent conductive layer.

The present invention also provides a solar cell module which includes a plurality of solar cells sealed between a front surface member and a rear surface member. According to this solar cell module, the solar cell includes: a crystalline semiconductor substrate of a first conductivity type; a first amorphous semiconductor layer of the first conductivity type formed on a first surface of the crystalline semiconductor substrate; a first collector electrode formed on the first amorphous semiconductor layer; a second amorphous semiconductor layer of second conductivity type formed on a second surface of the crystalline semiconductor substrate; and a second collector electrode formed on the second amorphous semiconductor layer. With the above, the first amorphous semiconductor layer is formed thereon with a transparent conductive layer and a transparent insulation layer in this order. The first collector electrode is formed to include a groove made in the transparent insulation layer. The second amorphous semiconductor layer is formed with a transparent conductive layer thereon. The second collector electrode is formed on a surface of the second transparent conductive layer. A region in the transparent conductive layer formed with the second collector electrode has the same surface profile as of the other regions in the transparent conductive layer. The first collector electrode has a surface which faces the front surface member, and the second collector electrode having a surface which faces the rear surface member.

Also, the solar cell module may further include a terminal box disposed on a surface of the rear surface member.

The present invention also provides a method for manufacturing a solar cell. The method includes: a step of forming an amorphous semiconductor layer of one conductivity type on a front-surface side of a crystalline semiconductor substrate of said conductivity type and forming an amorphous semiconductor layer of another conductivity type on a rear-surface side thereof; a step of forming a transparent conductive layer on each of the amorphous semiconductor layers; a step of forming a transparent insulation layer on the front-surface side transparent conductive layer; a step of forming an open groove which reaches the transparent conductive layer by selectively removing the transparent insulation layer; a step of forming a front-surface side collector electrode in the open groove by plating; and a step of forming a rear-surface-side collector electrode on the rear-surface-side transparent conductive layer by printing method or vapor deposition method.

The opening may be formed by laser.

Advantageous Effects of Invention

According to the present invention, the first amorphous semiconductor which is formed on the first surface of the crystalline semiconductor substrate has the same conductivity type as the crystalline semiconductor substrate, and a collector electrode is formed on this first amorphous semiconductor by plating. Therefore, the invention grants a margin in the control of manufacturing steps such as the formation conditions and thus provides a solar cell which has superior productivity in mass manufacturing.

The invention also provides an arrangement that the transparent conductive layer and the transparent insulation layer are formed in this order on the first amorphous semiconductor layer, and the first collector electrode is formed to include a groove which is made in the transparent insulation layer. In this case, there is no major problem even if the groove has reached the substrate since the substrate and the front-surface-side amorphous semiconductor layer have the same conductivity type. Therefore, the invention grants a margin in the control of manufacturing steps such as the formation conditions and thus provides a solar cell which has superior productivity in mass manufacturing and a method for manufacturing it.

DESCRIPTION OF EMBODIMENTS

Embodiments of the present invention will be described in detail with reference to the drawings. It should also be noted that all the drawings are conceptual sketches and may not reflect actual dimensional proportions, etc. Therefore, information about specific dimensions, etc. should be understood and determined from the description to be given hereafter. Keep in mind that proportional and other relationships may also differ from one drawing to another.

Figure 1:
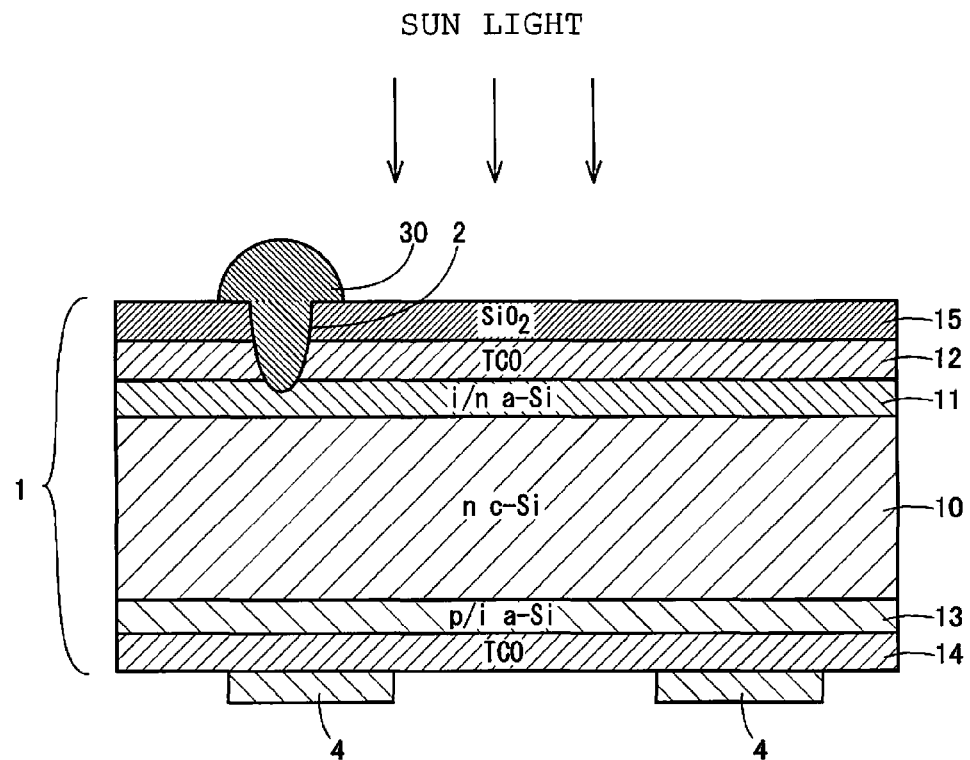
FIG. 1 is a sectional view which shows a structure of a solar cell according to an embodiment of the present invention.

FIG. 1 is a sectional view which shows a structure of a solar cell according to an embodiment of the present invention. In this Figure, components which have essentially equivalent to those in FIG. 15 are indicated by the same reference symbols.

Figure 15:
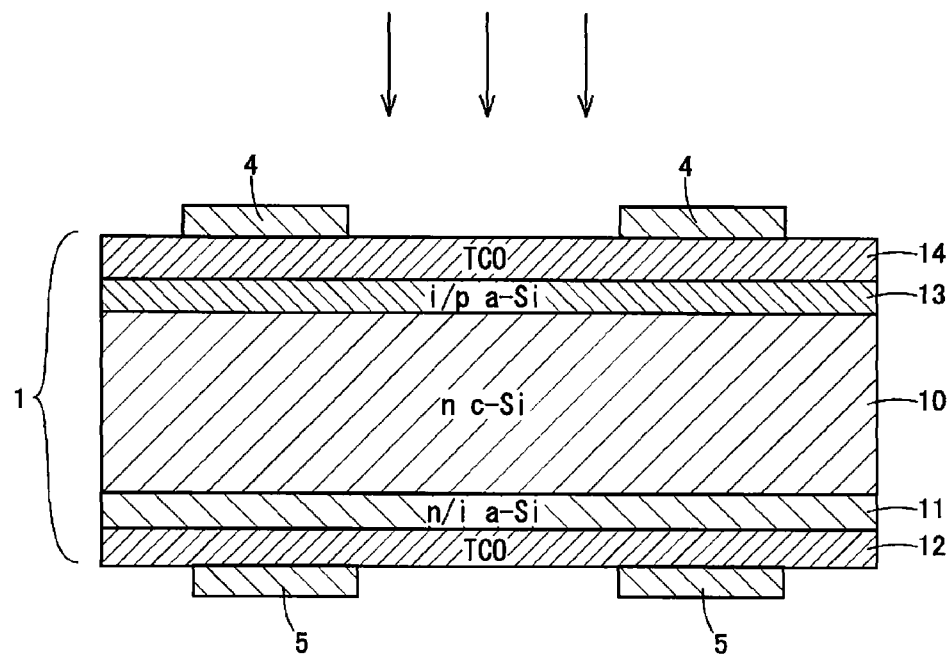
FIG. 15 is a sectional view which shows a structure of an HIT solar cell.

The solar cell in this embodiment differs from the conventional one shown in FIG. 15 in that the side provided with an n-type amorphous silicon layer 11 which has the same conductivity type as a crystalline semiconductor substrate 10 is used as the front side, so that sun light incident is mainly from the n-type amorphous silicon layer 11 side. In other words, the front-rear relationship is the opposite of the ordinary solar cells.

As shown in FIG. 1, a n-type monocrystalline silicon substrate 10 as the crystalline semiconductor substrate has its front surface (light receiving surface) side formed with the n-type amorphous silicon layer 11 via an i-type amorphous silicon layer. The i-type amorphous silicon layer and the n-type amorphous silicon layer 11 are very thin films, with a combined thickness of the two layers being approximately 10 nm. On the front-surface side of the n-type amorphous silicon layer 11, there is formed a transparent conductive layer (TCO) 12 of a transparent conductive oxide such as ITO, having a film thickness of approximately 100 nm. Further, on the front-surface side of the transparent conductive layer 12, a transparent insulation layer 15 is formed of silicon oxide ($SiO_x$), etc.

On the other hand, the n-type monocrystalline silicon substrate 10 has its rear-surface side formed with a p-type amorphous silicon layer 13 via an i-type amorphous silicon layer. The p-type amorphous silicon layer 13 has its rear-surface side formed with a transparent conductive layer 14.

In this embodiment, plating method is employed to form a comb-shaped collector electrode 30 on the front-surface side whereas screen printing, vapor deposition or other method is employed to form a comb-shaped collector electrode 4 on the rear-surface-side.

In order to form the front-surface side collector electrode by plating, at least the front surface transparent insulation layer 15 on the surface is removed in a pattern of the electrode by, for example, laser, mechanical grinding by scribing, wet etching using masks, etc. to form an open groove 2. The open groove 2 is made to a depth to reliably go beyond the transparent insulation layer 15. During the groove making operation, the open groove 2 may reach the substrate 10 due to some reasons such as tolerances in formation conditions for the open groove 2. This causes no major problem because the substrate 10 and the front-surface side amorphous silicon layer 11 are of the same conductivity type, i.e., n-type. In other words, the arrangement grants a margin in the control of manufacturing steps such as the formation conditions of the opening groove.

Metal seeds are formed in this open groove 2, and thereafter the collector electrode 30 is formed by plating, to have a width not greater than 50 μm and a height of approximately 10 μm. The collector electrode 30 made by plating has a rear resistance than collector electrodes made from conductive resin paste, and therefore the above-mentioned width and height provide a collector electrode which has a sufficiently low resistance.

Since the collector electrode 30 is formed by plating on the amorphous silicon layer 11 which has the same conductivity type as the substrate 10 according to the present invention, it is possible to make the width of the collector electrode 30 narrower than in the conventional ones which are formed by screen printing method or vapor deposition method using masks. Therefore, it is possible to reduce the area formed with the collector electrode 30 than in the conventional solar cells. For these reasons, the collector electrode 30 made by plating is on the light receiving side in the present invention. Such an arrangement reduces sun light incident loss due to the area shaded by the collector electrode 30, and increases the amount of light received by the substrate 10 accordingly. As a result, the invention improves photoelectric conversion characteristics.

The collector electrode 4 is formed on the p-type amorphous silicon layer 13 which makes a p-n junction with the substrate 10. For this reason, the collector electrode 4 is not formed by plating according to the present invention, but is formed by a method which does not impair the p-type amorphous silicon layer 13, such as screen printing method or vapor deposition method using masks.

Also, as mentioned earlier, the light receiving side is the side which is formed with the collector electrode 30 in the present invention. In other words, the collector electrode 4 is placed on the rear-surface side, which means sun light incident loss due to the area shaded by the collector electrode 4 does not pose a serious concern. For this reason, the collector electrode 4 is formed to cover a larger area than the collector electrode 30 to reduce resistance loss. Specifically, the collector electrode 4 is made by screen printing with Ag paste, to a height of 30 μm through 60 μm and a width of 60 μm through 200 μm and in a greater number of lines than the collector electrode 30 so that the electrode is formed on a larger area to achieve a predetermined resistance value. In the present embodiment the surface of the transparent conductive layer 14 does not receive surface treatment such as groove forming operation. Therefore, the surface of the region in the transparent conductive layer 14 formed with the collector electrode 4 remains the same as the surface of the other regions in the transparent conductive layer 14.

Also, since the transparent insulation layer 15 is transparent, the layer has a low light-absorption loss, and therefore need not be removed after the collector electrode has been formed by the plating operation, unlike the conventional resist. This can simplify the production process.

Further, the collector electrode 30 is in contact with the surface of the transparent conductive layer 12 and the side surface of the transparent insulation layer 15. In other words, the area of contact is increased as compared to conventional ones, resulting in improved adhesion.

The transparent insulation layer 15 can be formed with $SiO_2$. Other usable material therefor includes SiN, insulating oxides such as $TiO_2$ and $Al_2O_3$, and resin materials such as acrylic.

Further, when using the solar cell for power generation, normally, the solar cells are sealed between a light receiving-side reinforced glass and a rear surface film, using a transparent sealing material such as EVA (ethylene vinyl acetate copolymer). In consideration of this, the transparent insulation layer 15 may be designed to have a refraction index of approximately 1.5 which is substantially the same as of the reinforced glass and of EVA mentioned above. This reduces the loss of light caused by the transparent insulation layer 15 to a negligible level. Hence, it is preferable that the transparent insulation layer 15 is provided by a material which has substantially the same refraction index as of glass, such as $SiO_2$.

Figure 2:
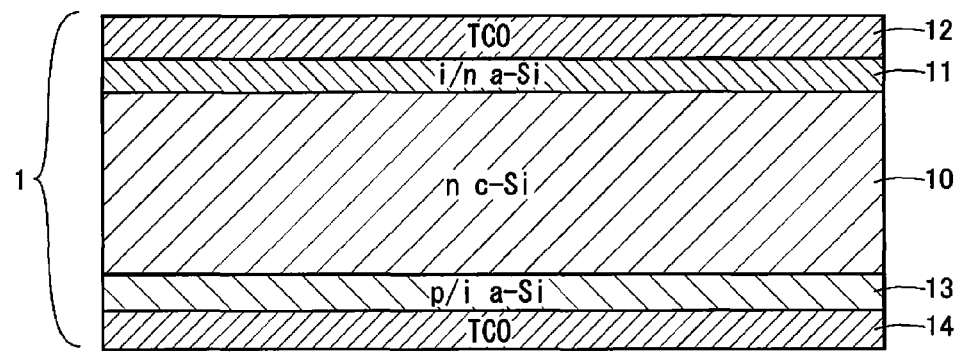
FIG. 2 is a sectional view which shows a production step in a manufacturing method of the solar cell according to the embodiment of the present invention.

The solar cell which has the above-described configuration according to the present invention can be manufactured as follows:

First, as shown in FIG. 2, an i-type amorphous silicon layer and an n-type amorphous silicon layer 11 are formed sequentially on a front surface (a first surface) side of an n-type monocrystalline silicon substrate 10 by using a plasma CVD method. Likewise, an i-type amorphous silicon layer and a p-type amorphous silicon layer 13 are formed sequentially on a rear surface (the second surface) side of the substrate. Next, a transparent conductive layer 12 and a transparent conductive layer 14 are formed on the amorphous silicon layer and the amorphous silicon layer 13 respectively by spattering method.

Figure 3:
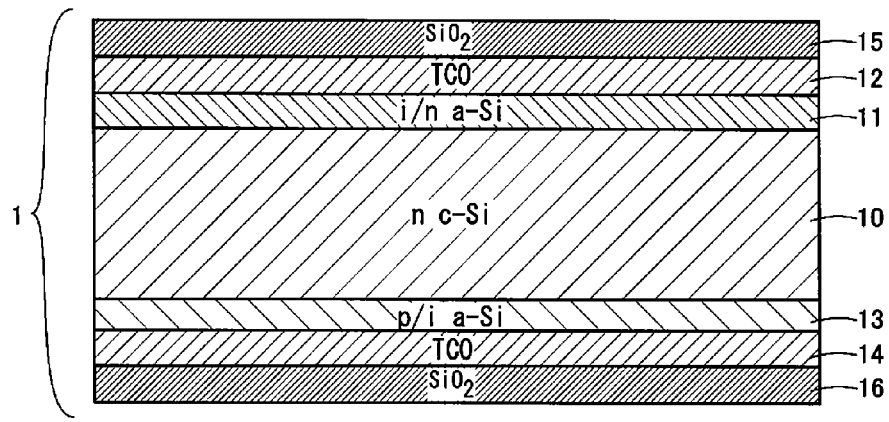
FIG. 3 is a sectional view which shows a production step in a manufacturing method of the solar cell according to the embodiment of the present invention.

Subsequently, as shown in FIG. 3, transparent insulation layers 15, 16 are formed of silicon oxide for example, on the surfaces of the transparent conductive layer 12 and the transparent conductive layer 14 respectively. The transparent insulation layers 15, 16 are formed by plasma CVD method.

Figure 4:
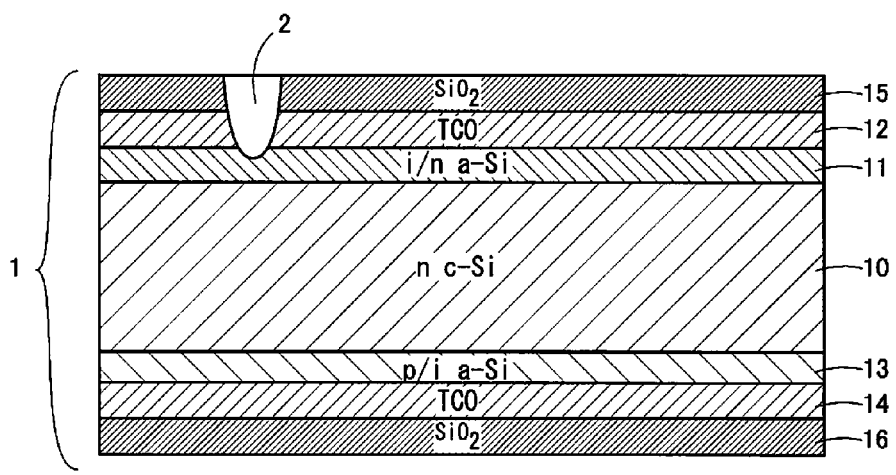
FIG. 4 is a sectional view which shows a production step in a manufacturing method of the solar cell according to the embodiment of the present invention.

Then, as shown in FIG. 4, an open groove 2 is formed by removing at least the transparent insulation layer 15 on the surface completely in the electrode pattern. In the present embodiment laser irradiation is used to form the open groove 2 and remove the transparent insulation layer 15. The laser irradiation should be performed under a set of conditions which enables removal of a very thin surface layer, so as to remove at least the insulation film 15 on the surface. For example, when femtosecond laser is utilized, the wavelength should be 800 nm, with the cyclic frequency of 1 kHz (a few tenth kHz through 50 kHz). The laser energy is 1 mJ (0.3 through 20 mJ) pulse energy, with the pulse width of 120 fs (50 through 250 fs).

Also, high-harmonic YVO4 laser may be used at a 355 nm wavelength for example, under the conditions of 80 kHz (50 through 200 kHz), and 12 nS (5 through 200 nS) pulse width, and 2.5 W (1 through 10W) output at the processing point.

It should be noted here that the open groove 2 may be formed by other methods than lasering. Examples include mechanical grinding such as scribing, and wet etching using masks.

In this step of making the open groove 2, only essential requirement is to reliably remove the transparent insulation layer 15. So, a certain level of over-etching is tolerable in forming the open groove 2 and there is no problem even if the deepest point of the groove 2 has reached the n-type crystalline silicon substrate 10 since the amorphous silicon layer 11 and the substrate 10 have the same conductivity type.

Figure 5:
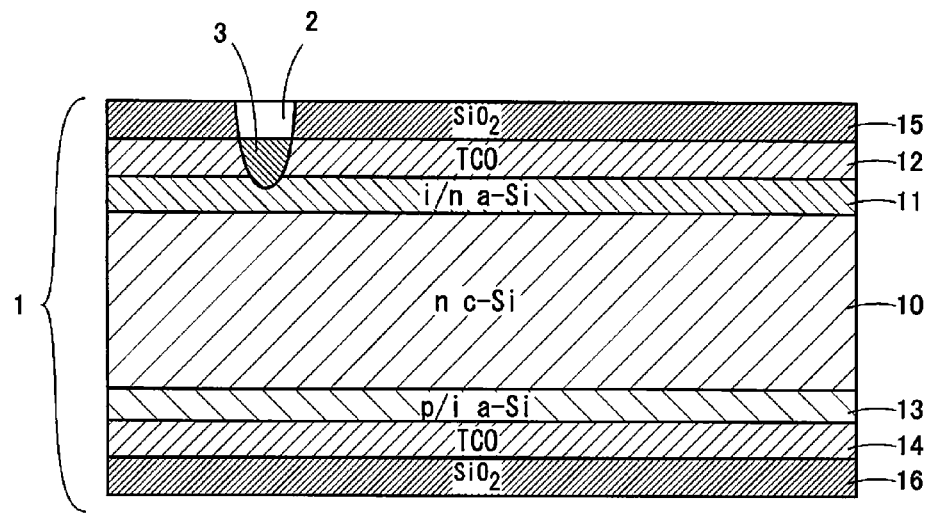
FIG. 5 is a sectional view which shows a production step in a manufacturing method of the solar cell according to the embodiment of the present invention.

Subsequently, as shown in FIG. 5, metal seeds 3 of Ag are formed in the open groove 2. The metal seeds 3 are formed by ink-jet method or photoelectrochemical plating method.

Figure 6:
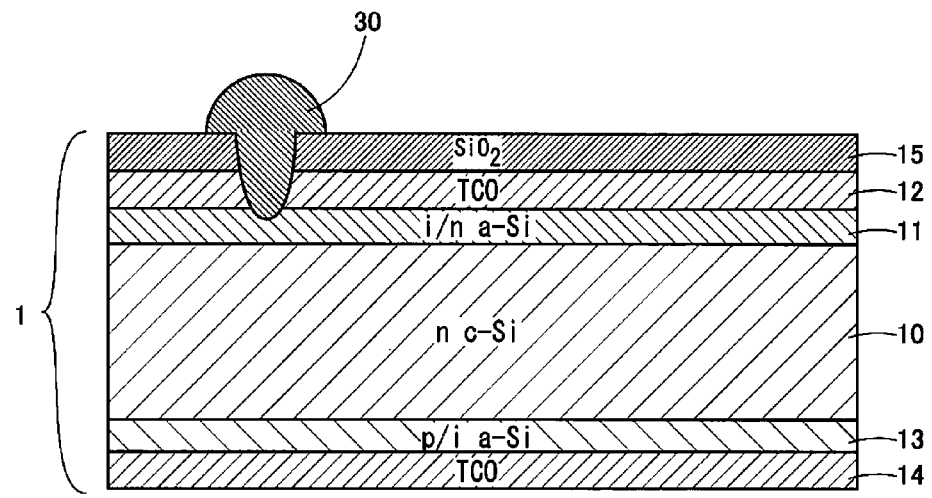
FIG. 6 is a sectional view which shows a production step in a manufacturing method of the solar cell according to the embodiment of the present invention.

Thereafter, as shown in FIG. 6, the front-surface side collector electrode 30 is formed by electroplating using the metal seeds 3. The electroplating is performed on the Ag metal seeds 3 which are formed in the open groove 2. The electroplating is performed first by activating the surface with sulfuric acid of 10% concentration, and then soaking a work into a plating solution in which additives are added to copper sulfate, as a negative electrode, to form a copper electrode. Thereafter, the work is soaked in a plating solution containing organic acid tin, thereby forming the copper electrode with a tin electrode to complete the formation of the collector electrode 30, and of the solar cell according to the present embodiment. The obtained collector electrode 30 by plating is a comb-shaped electrode which has a width (a) not greater than 50 μm, and a height (b) of approximately 10 μm. Then, the insulation film 16 on the rear-surface-side is removed.

Figure 7:
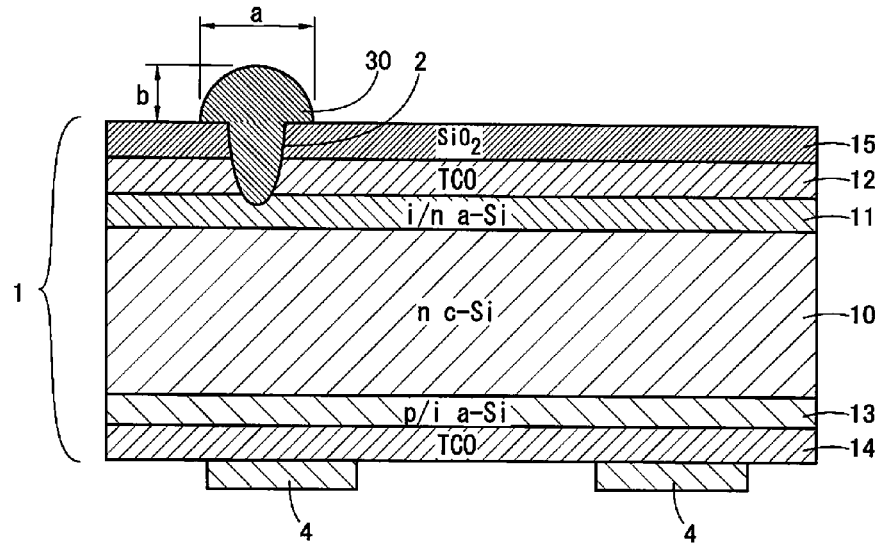
FIG. 7 is a sectional view which shows a production step in a manufacturing method of the solar cell according to the embodiment of the present invention.

Then, as shown in FIG. 7, a collector electrode 4 is formed on the rear-surface-side transparent conductive layer 14 by screen printing with Ag paste so as not to impair the p-n junction. In this collector electrode 4, the width and the number of lines of the electrode are increased in order to reduce resistance. Such an adjustment as increasing the width or the number of lines does not prevent sun light incidence since the p-type amorphous silicon layer 13 is on the rear-surface side.

As has been described thus far, the present invention provides a solar cell which has superior photoelectric conversion characteristics and mass production efficiency. Further, since removal of the collector electrode can be reduced, the invention provides a highly reliable solar cell.

In the embodiment described above, the rear-surface-side collector electrode 4 is formed by screen printing method or vapor deposition method, but the present invention is not limited to these. As far as a surface of the rear-surface-side transparent conductive layer 19 does not undergo a surface treatment such as groove making operation, the rear-surface-side collector electrode may be formed by plating method for example.

Herein, another embodiment of the present invention, which has a rear-surface-side collector electrode formed by plating method will be described with reference to FIG. 8 through FIG. 11. FIG. 8 through FIG. 11 are sectional views each showing a production step in a manufacturing method of the solar cell according to the above-mentioned another embodiment of the present invention.

Like the previous embodiment described earlier, an i-type amorphous silicon layer and an n-type amorphous silicon layer 11 are formed sequentially on the front surface (first surface) side of an n-type monocrystalline silicon substrate 10 using a plasma CVD method whereas an i-type amorphous silicon layer and a p-type amorphous silicon layer 13 are formed sequentially on the rear surface (second surface) side of the substrate. Next, a transparent conductive layer 12 and a transparent conductive layer 14 are formed on the amorphous silicon layer 11 and the amorphous silicon layer 13 by spattering method.

Figure 8:
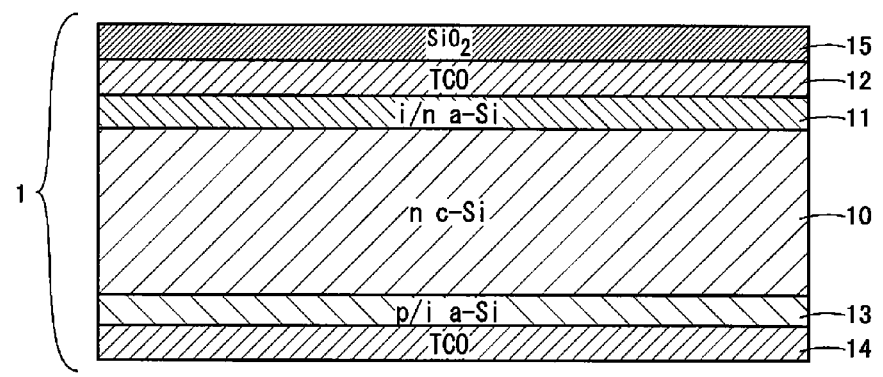
FIG. 8 is a sectional view which shows a production step in a manufacturing method of the solar cell according to another embodiment of the present invention.

Subsequently, as shown in FIG. 8, a transparent insulation layer 15 is formed of silicon oxide for example, on the surfaces of the transparent conductive layer 12. The transparent insulation layer 15 is formed by plasma CVD method. In this formation step, a transparent insulation layer is not formed on the surface of the rear-surface-side transparent electrode 14.

Figure 9:
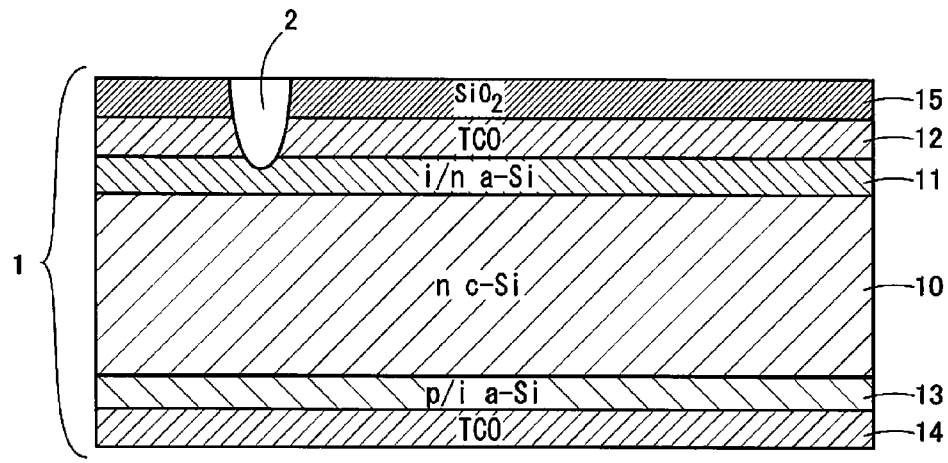
FIG. 9 is a sectional view which shows a production step in a manufacturing method of the solar cell according to said another embodiment of the present invention.

Then, as shown in FIG. 9, an open groove 2 is formed by removing at least the transparent insulation layer 15 on the surface completely in the electrode pattern. The open groove 2 is formed in the same method as in the previous embodiment. No treatment such as groove making is performed to the surface of the rear-surface-side transparent conductive layer 14.

In this step of making the open groove 2, only essential requirement is to reliably remove the transparent insulation layer 15. So, a certain level of over-etching may be performed in forming the open groove 2 and there is no problem even if the deepest point of the groove 2 has reached the n-type crystalline silicon substrate 10 since the amorphous silicon layer 11 and the substrate 10 has the same conductivity type.

Figure 10:
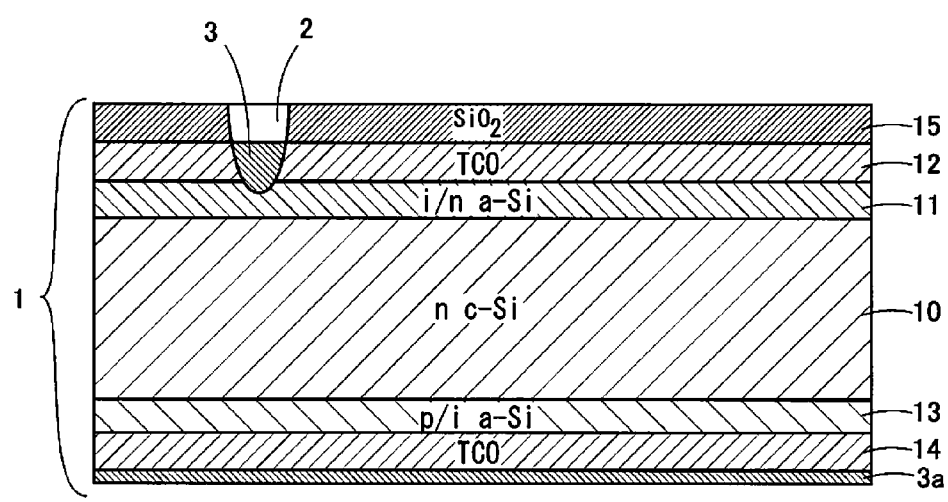
FIG. 10 is a sectional view which shows a production step in a manufacturing method of the solar cell according to said another embodiment of the present invention.

Subsequently, as shown in FIG. 10, metal seeds 3 of Ag are formed in the open groove 2. Also, a metal seed layer 3a is formed on the entire surface of the rear-surface-side transparent conductive layer 14. The metal seeds 3, 3a are formed by ink-jet method or photoelectrochemical plating method. Note, however, that it is not absolutely necessary to form the rear-surface-side metal seed layer 3a.

Figure 11:
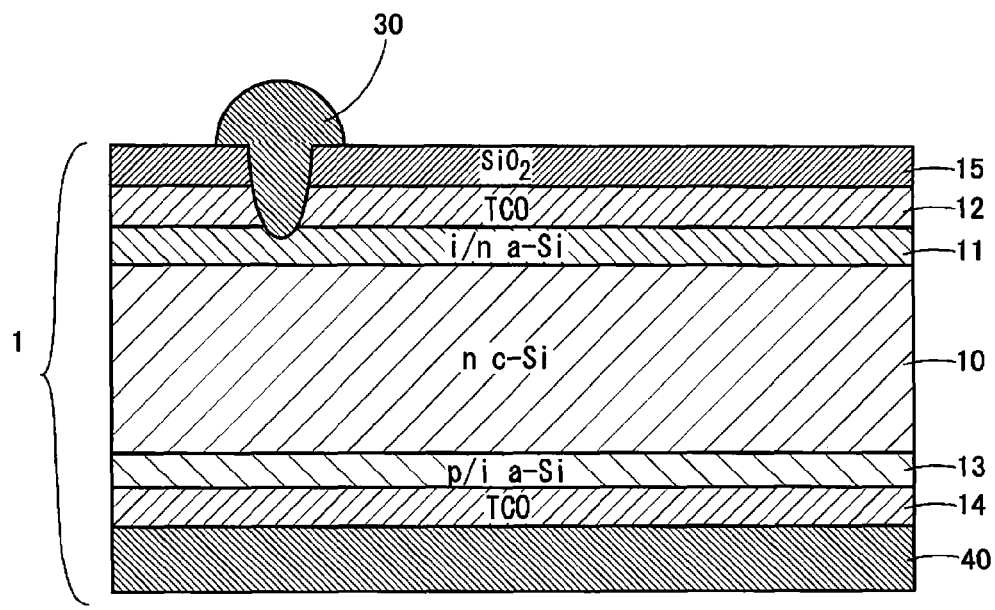
FIG. 11 is a sectional view which shows a production step in a manufacturing method of the solar cell according to said another embodiment of the present invention.

Thereafter, as shown in FIG. 11, a collector electrode 30 is formed on the front-surface side, and a collector electrode 40 is formed on the entire surface of the rear-surface-side transparent conductive layer 14, by electroplating using the metal seeds 3 and the metal seed layer 3a. The electroplating is performed in the same way as in the previous embodiment.

Following the steps as described, there is obtained a solar cell which has a front-surface side formed with a collector electrode 30 by plating method, and an entire surface of the rear-surface-side transparent conductive layer 14 formed with a collector electrode 40 by plating method.

As described already, formation of the collector electrode 40 by plating method on the rear-surface-side transparent conductive layer 14 does not impair the p-n junction since no treatment has been made to the surface of the transparent conductive layer 14. Therefore, the embodiment provides the same advantages as offered by the previous embodiment.

In addition, this embodiment makes the manufacturing process even simpler since the embodiment does not require the steps of forming and removing the transparent insulation layer 16 which is necessary in the previous embodiment.

Also, by using plating method, it becomes possible to lower the resistance of the collector electrode 40. The collector electrode 40 which is formed all over the surface is on the rear surface, so it does not prevent sun light incident.

Figure 12:
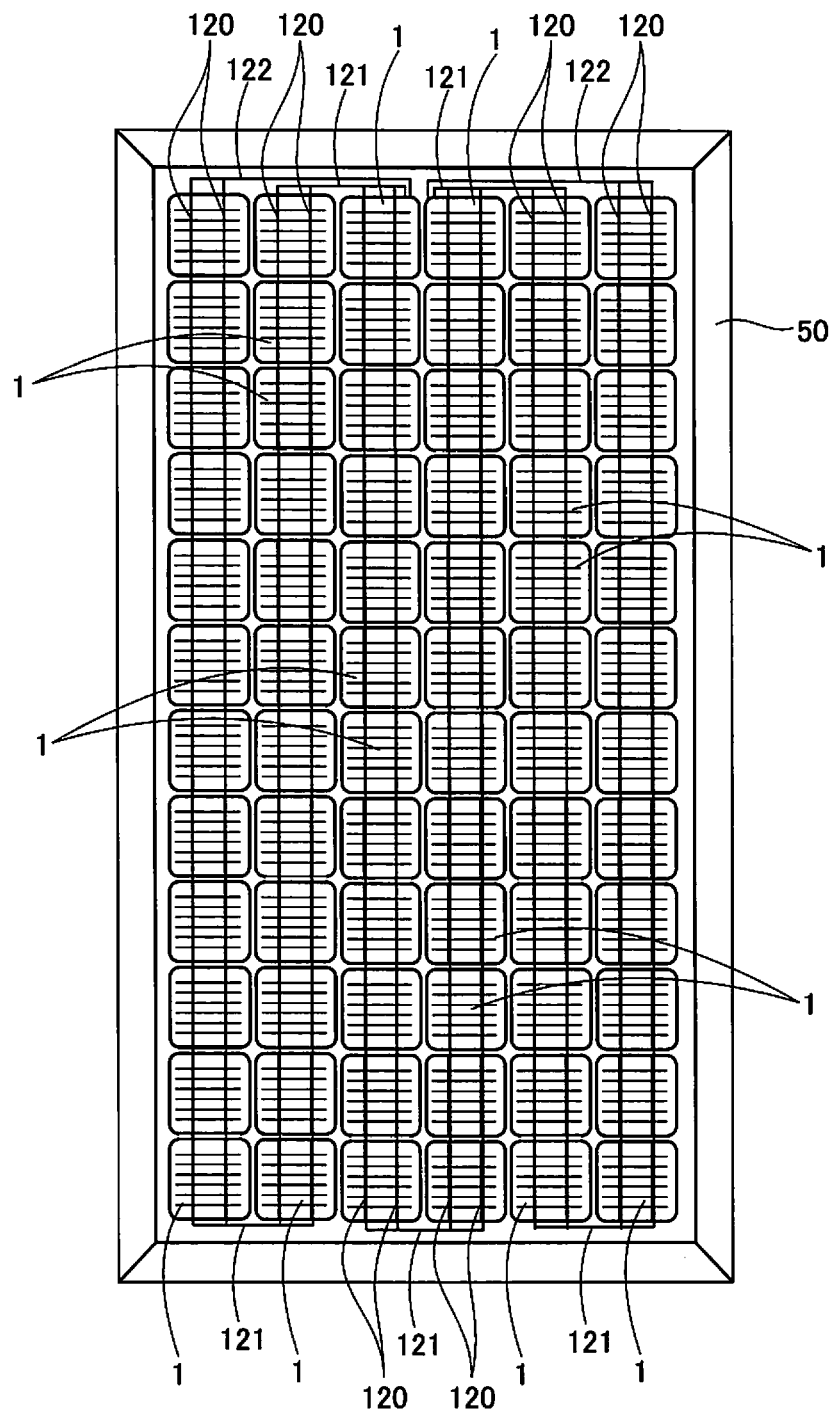
FIG. 12 is a plan view which shows a solar cell module according to an embodiment of the present invention.
Figure 13:
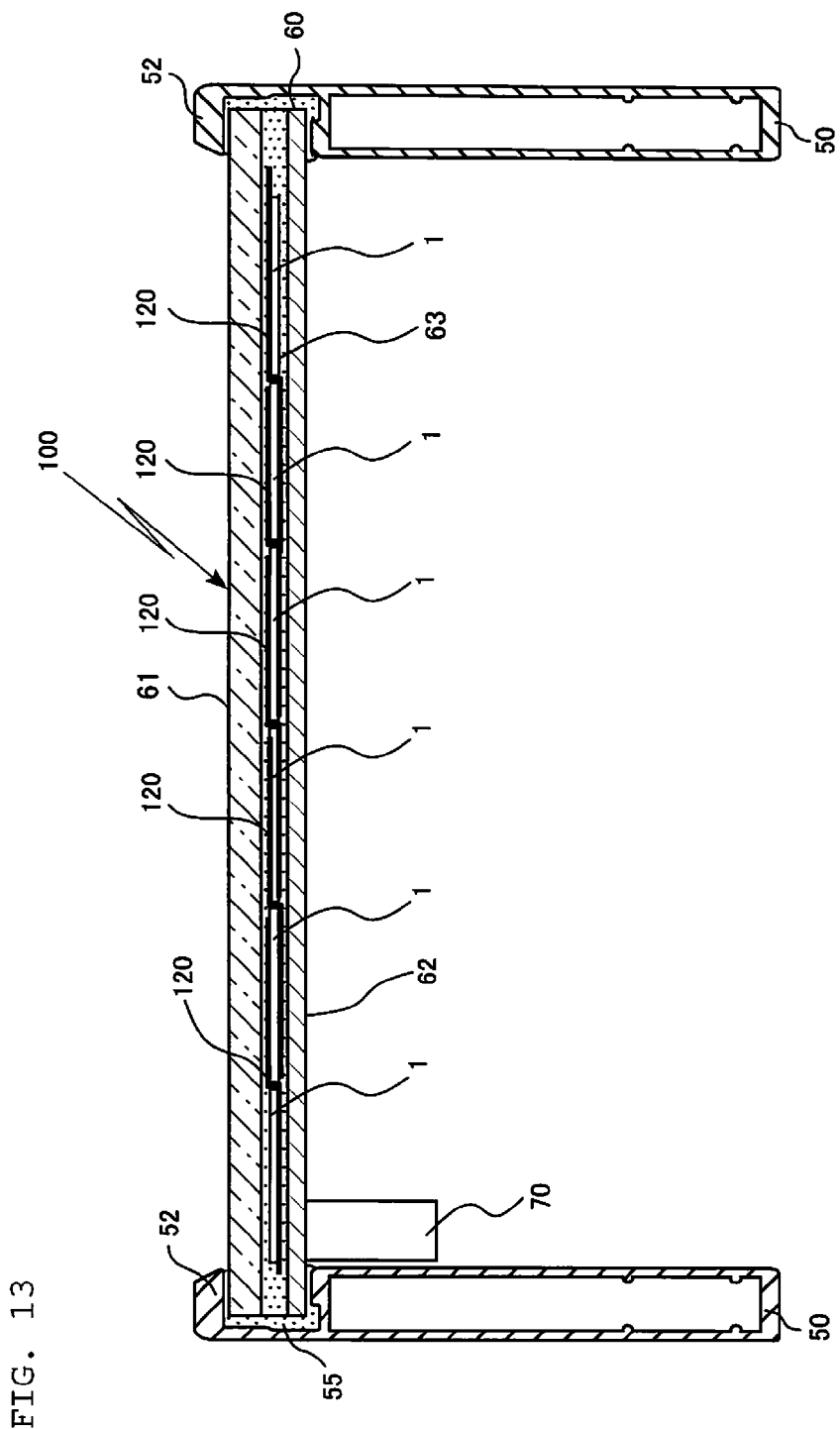
FIG. 13 is a simplified sectional view of the solar cell module according to the embodiment of the present invention.
Figure 14:
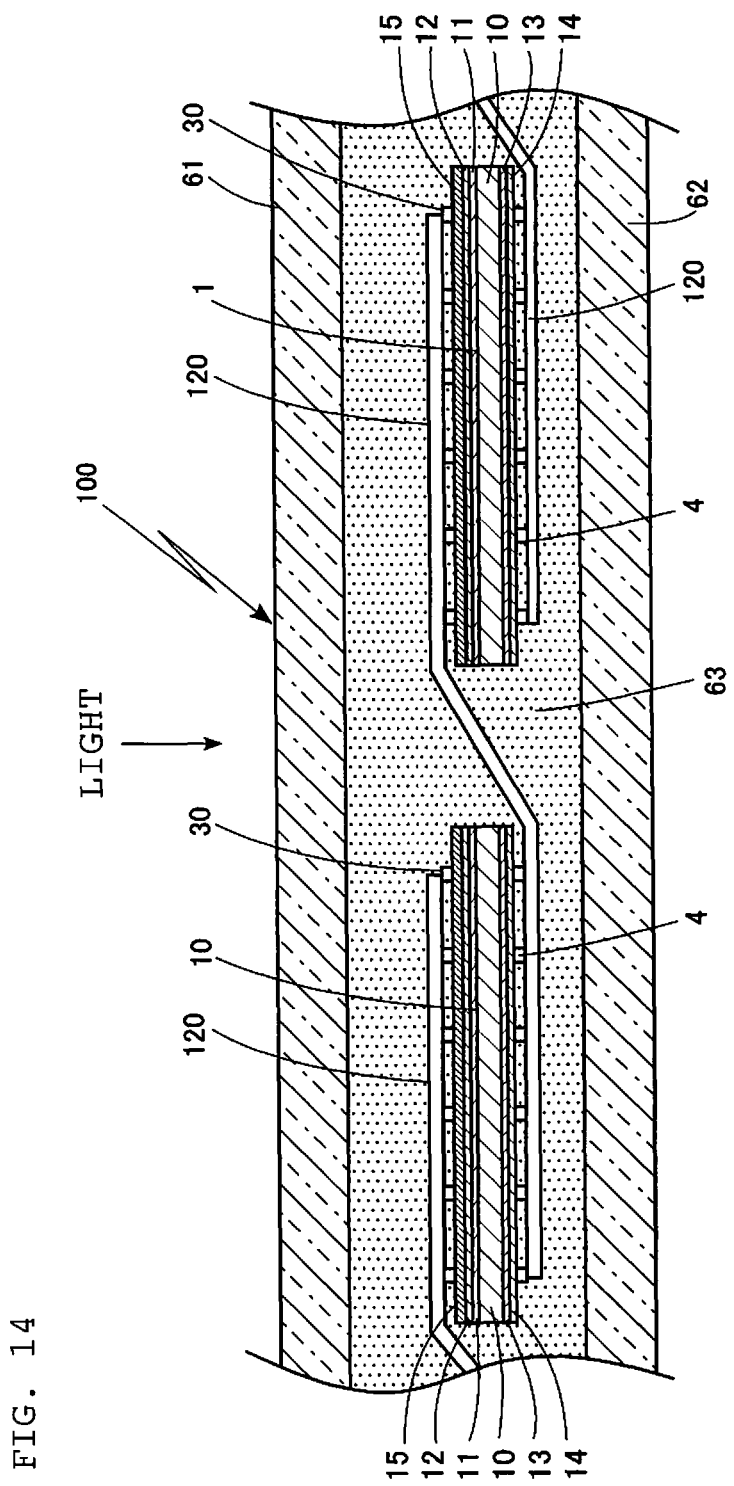
FIG. 14 is a sectional view which shows essential part of the solar cell module according to an embodiment of the present invention.

Referring to FIG. 12 through FIG. 14, a solar cell module using the solar cell 1 according to the present invention will be described. FIG. 12 is a plan view which shows a solar cell module according to an embodiment of the present invention, FIG. 13 is a simplified sectional view of the solar cell module according to the embodiment of the present invention, and FIG. 14 is a sectional view which shows essential part of the solar cell module according to an embodiment of the present invention.

In the solar cell 1 which is formed as described earlier, a collector electrode 30 which is formed by plating is disposed on a light receiving side whereas a collector electrode 4 which is formed by printing method or vapor deposition method is disposed on a rear-surface-side. A plurality of this solar cell 1 are each electrically connected with the adjacent solar cells 1 with wiring members 120 which are made of flat copper foils, etc. Specifically, each wiring member 120 has its first-end side connected to the collector electrode 30 which faces a front surface member 61 side of a solar cell 1 while its second-end side is connected to the collector electrode 4 which faces a rear surface member 62 side of an adjacent solar cell 1.

Thus, a plurality of the solar cells 1 are electrically connected with each other by the wiring members 120 which are made of a conductive material such as copper foil, and then are sealed between the front surface member 61 which is transparent and is made of glass or transparent plastic and the rear surface member 62 which is made of weather resistant film, glass or plastic, with a transparent sealing member 63 which has good weather resistance and moisture resistance such as EVA.

These solar cells 1 are connected in series by the wiring members 120, so that a predetermined output of 200 W, for example, can be outputted from the solar cell module 100 via transition wires 121 and power lead-out wires 122.

As needed, an outer periphery of the solar cell module 100 described above is provided with an outer frame 50 which is made of aluminum for example, by being fitted into a U-shaped in cross-section fitting part 52 with a sealing member 60. The outer frame 50 is formed of aluminum, stainless steel, roll-formed steel, etc. A terminal box 70 is provided on a surface of the rear surface member 62 for example.

The embodiments described above utilize a monocrystalline silicon substrate as a crystalline semiconductor substrate. However, polycrystalline silicon substrates may also be used. Also, the combination of the conductivity types in the semiconductor materials may be different from the one described for the embodiments.

All of the embodiments disclosed herein are to show examples, and should not be considered as of a limiting nature in any way. The scope of the present invention is identified by the claims and is not by the descriptions of the embodiments given hereabove, and it is intended that the scope includes all changes falling within equivalents in the meaning and extent of the claims.

REFERENCE SIGNS LIST 10 n-type monocrystalline silicon substrate
11 n-type amorphous silicon layer
12 transparent conductive layer
13 p-type amorphous silicon layer
14 transparent conductive layer
15 transparent insulation layer
2 open groove
3 metal seeds
30 collector electrode (plating)
4 collector electrode 61 front surface member
62 rear surface member
50 frame
70 terminal box

The invention claimed is:

1. A method for manufacturing a solar cell, comprising:
forming an amorphous semiconductor layer of N conductivity type on a light incident front-surface side of a crystalline semiconductor substrate of said N conductivity type and forming an amorphous semiconductor layer of P conductivity type on a rear-surface side thereof;
forming a transparent conductive layer on each of the amorphous semiconductor layers;
forming a transparent insulation layer on the front-surface side transparent conductive layer;
forming an open groove by selectively removing both of the transparent insulation layer and the front-surface side transparent conductive layer by laser; wherein a width of the open groove where the open groove penetrates the surface border of the transparent insulated layer is larger than a width of the open groove where the open groove penetrates the border of the transparent insulated layer and the transparent conductive layer;
forming a front-surface side collector electrode in the open groove by plating; and
forming a rear-surface-side collector electrode on the rear-surface-side transparent conductive layer.

2. The method for manufacturing the solar cell according to claim 1, wherein the rear-surface side collector electrode is formed by plating.

3. The method for manufacturing the solar cell according to claim 1, wherein the rear-surface side collector electrode is formed by printing method or vapor deposition method.

4. The method for manufacturing the solar cell according to claim 1, wherein the front-surface side collector electrode is in contact with a surface of the transparent conductive layer and a side surface of the transparent insulation layer.

5. The method for manufacturing the solar cell according to claim 1, wherein the rear-surface side collector is formed to cover a larger area than the front-surface side collector electrode.

6. The method for manufacturing the solar cell according to claim 1, wherein the transparent conductive layer is formed on the amorphous semiconductor layers prior to when the transparent insulation layer is formed on the front-surface side transparent conductive layer.

7. The method for manufacturing the solar cell according to claim 1, wherein the vertical cross-section of the formed front-surface side collector electrode is curved downwards in a concave manner away from the cross-sectioned edges of the border of the transparent insulated layer and the transparent conductive layer and towards the border of the transparent conductive layer and the amorphous semiconductor layer of N conductivity type.

8. The method for manufacturing the solar cell according to claim 1, wherein the open groove is formed by additionally removing a portion of the amorphous semiconductor layer of N conductivity and wherein the front-surface side collector electrode penetrates the amorphous semiconductor layer of N conductivity type.

9. A method for manufacturing a solar cell, comprising:
forming an amorphous semiconductor layer of N conductivity type on a light incident front-surface side of a crystalline semiconductor substrate of said N conductivity type and forming an amorphous semiconductor layer of P conductivity type on a rear-surface side thereof;
forming a transparent conductive layer on each of the amorphous semiconductor layers;
forming a transparent insulation layer on the front-surface side transparent conductive layer;
forming an open groove by selectively removing the transparent insulation layer, the front-surface side transparent conductive layer and a portion of the amorphous semiconductor layer of N conductivity by laser;
forming a front-surface side collector electrode in the open groove by plating into the amorphous silicon layer of N conductivity;
forming a rear-surface-side collector electrode on the rear-surface-side transparent conductive layer.

10. The method for manufacturing the solar cell according to claim 1, wherein the amorphous semiconductor layer of N conductivity is 10 nm thick.

11. The method for manufacturing the solar cell according to claim 9, wherein the amorphous semiconductor layer of N conductivity is 10 nm thick.

12. A method for manufacturing a solar cell, comprising:
forming an amorphous semiconductor layer of N conductivity type on a light incident front-surface side of a crystalline semiconductor substrate of said N conductivity type and forming an amorphous semiconductor layer of P conductivity type on a rear-surface side thereof;
forming a transparent conductive layer on each of the amorphous semiconductor layers;
forming a transparent insulation layer on the front-surface side transparent conductive layer;
forming an open groove by selectively removing both of the transparent insulation layer and the front-surface side transparent conductive layer by laser; wherein a width of the open groove where the open groove penetrates the border of the transparent insulated layer and the transparent conductive layer is larger than a width of the open groove where the open groove penetrates the border of the transparent conductive layer and the amorphous semiconductor layer of N conductivity type;
forming a front-surface side collector electrode in the open groove by plating; and
forming a rear-surface-side collector electrode on the rear-surface-side transparent conductive layer.

* * * * *